United States Patent [19]

Yamamoto

[11] Patent Number: 5,034,634

[45] Date of Patent: Jul. 23, 1991

[54] MULTIPLE LEVEL PROGRAMMABLE LOGIC INTEGRATED CIRCUIT

[75] Inventor: Norihito Yamamoto, Ohtsu, Japan

[73] Assignee: Omron Tateisi Electronics Co., Kyoto, Japan

[21] Appl. No.: 452,830

[22] Filed: Dec. 21, 1989

[30] Foreign Application Priority Data

Dec. 23, 1988 [JP] Japan .......................... 63-167063[U]

[51] Int. Cl.$^5$ .......................................... H03K 19/177
[52] U.S. Cl. .................................... 307/465; 307/475
[58] Field of Search ................ 307/443, 465, 468–469, 307/475, 264

[56] References Cited

U.S. PATENT DOCUMENTS 4,527,079 7/1985 Thompson .......................... 307/475
4,710,842 12/1987 Suzuki et al. ................ 307/465.1 X Primary Examiner—David Hudspeth
Attorney, Agent, or Firm—Foley & Lardner

[57] ABSTRACT

A programmable logic IC comprising an input buffer segment, a programmable logic segment and an output buffer segment, the input buffer segment and output buffer segment respectively comprising buffers of a first level and buffers of a second level as disposed in parallel arrays of the two levels and whichever of the levels being optionally selectable by programming.

6 Claims, 2 Drawing Sheets

MULTIPLE LEVEL PROGRAMMABLE LOGIC INTEGRATED CIRCUIT

BACKGROUND OF THE INVENTION

1. Field of the Invention

The present invention relates to a programmable logic integrated circuit which can interface with any of, for example, TLL level and C-MOS devices.

2. Brief Description of the Prior Art

A programmable logic integrated circuit consists of generally an input buffer segment, a programmable logic segment and an output buffer segment. A specific example of this type of programmable logic integrated circuit is illustrated in FIG. 3. As illustrated, an input buffer segment 1 is comprised of input buffers $10_{-1}$, $10_{-2}, \ldots, 10_{-n}$, and an output buffer segment 2 comprises output buffers $20_{-1}, 20_{-2}, \ldots, 20_{-n}$. A programmable logic segment 3 comprises a matrix unit 31 formed from a plurality of lines and rows, OR circuits $32_{-1}; 32_{-2}, \ldots, 32_{-n}$, and exclusive OR circuits $33_{-1}, 33_{-2}, \ldots, 33_{-n}$. A transistor (not shown) is positioned at each junction between the line and row of the matrix 31, and according to the program, the transistors at necessary junctions are kept active, while those at the remaining junctions are blocked. In this manner, AND circuits are formed using the rows with active transistors as inputs and lines with active transistors as outputs. Each of these AND circuits is indicated at A. The illustrated programmable logic integrated circuit has been implemented with bipolar transistors and recently has been implemented using C-MOS transistors for reduced consumption current.

As mentioned above, the early programmable logic integrated circuit was implemented with bipolar transistors and the peripheral integrated circuit was also usually bipolar. Therefore, the interface of the input and output buffers was naturally interfaced at the TTL level.

However, to reduce the consumption of current, programmable logic ICs of C-MOS construction have been developed. In consideration of the bipolar integrated circuit to be interfaced, the input and output buffers are designed to interface at the TTL level. If one attempts to use C-MOS integrated circuits for the peripheral integrated circuit, too, entire electronic circuit board consists of of C-MOS integrated circuits and the peripheral C-MOS IC must be connected to the conventional programmable logic integrated circuit. The device itself is of C-MOS construction but the interface is of TTL construction, and the problem of a conflict of level occurred. Therefore, a level-changing circuit must be provided in order to convert a system comprising a C-MOS device and a TTL peripheral integrated circuit to an all C-MOS system, it is necessary to redesign the board requiring additional development time and cost.

The present invention is intended to solve this problem by providing a programmable logic IC which can interface at either TTL and C-MOS levels.

SUMMARY OF THE INVENTION

The programmable logic IC according to the present invention comprises an input buffer segment, a programmable logic segment and an output buffer segment, the input and output buffer segments respectively comprise first-level buffers and second-level buffers for the respective input and output terminals so that either of the two levels may be selected by a programming procedure.

In programmable logic integrated circuit of the present invention, for instance, the first and second levels are respectively TTL and C-MOS levels, and both input and output buffer segments are programmed to let the first level buffers function when TTL is used for the peripheral integrated and let the second level function when a C-MOS integrated circuit is used for the peripheral integrated circuit.

BRIEF DESCRIPTION OF THE DRAWINGS

The above and other objects, advantages and features of this invention will be more fully understood when considered in conjunction with the following figures, in which.

DETAILED DESCRIPTION OF THE PREFERRED EMBODIMENTS

The present invention is described below in detail, by way of preferred embodiments.

Figure 3:
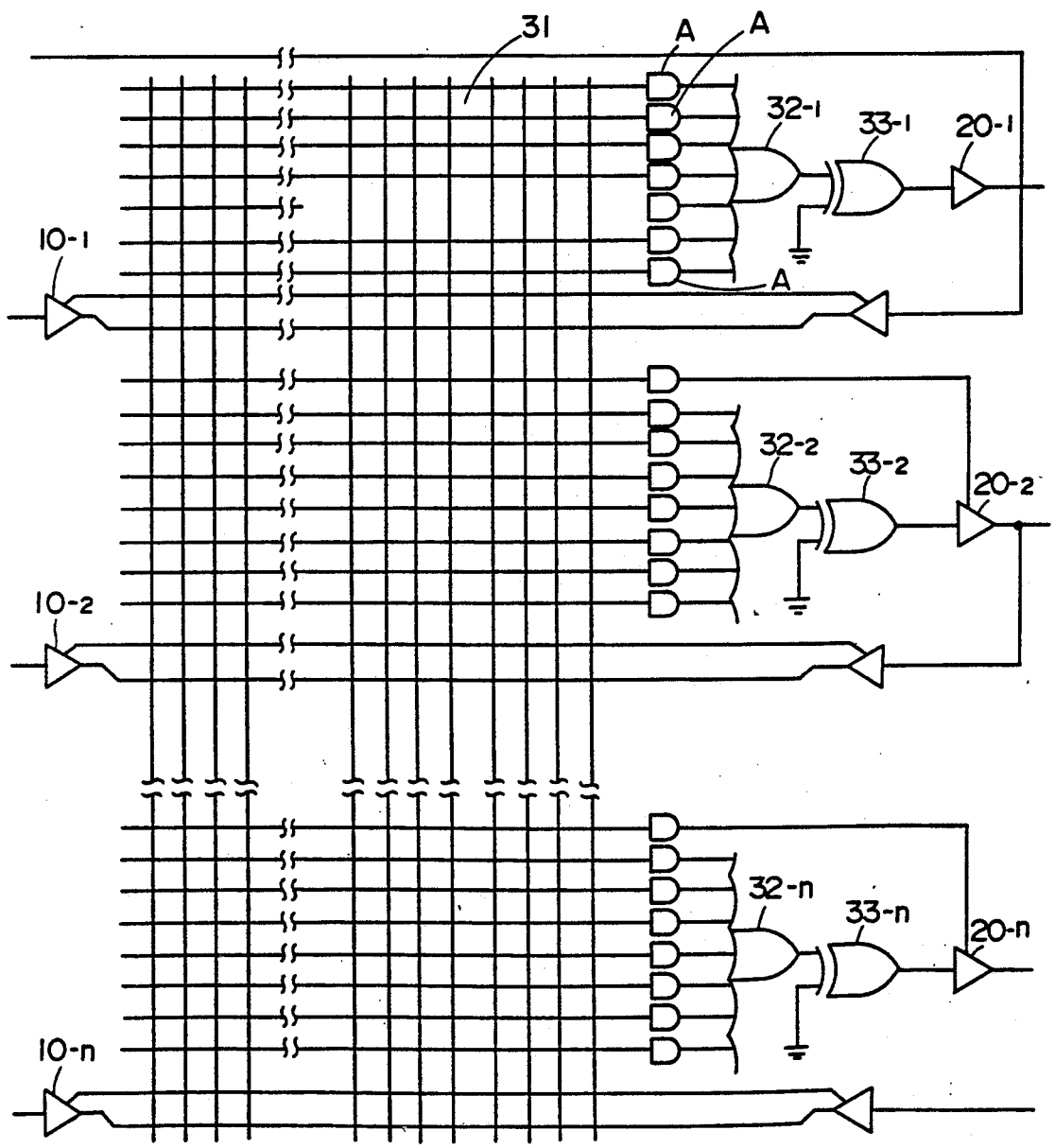
FIG. 3 is a circuit diagram showing the conventional programmable logic integrated circuit.

The programmable logic integrated circuit according to one embodiment of the invention is similar to the programmable logic integrated circuit illustrated in FIG. 3 in that it is comprised by an input buffer segment 1, an output buffer segment 2 and a programmable logic segment 3. In the internal construction of the programmable logic 3 there is generally no difference.

Figure 1:
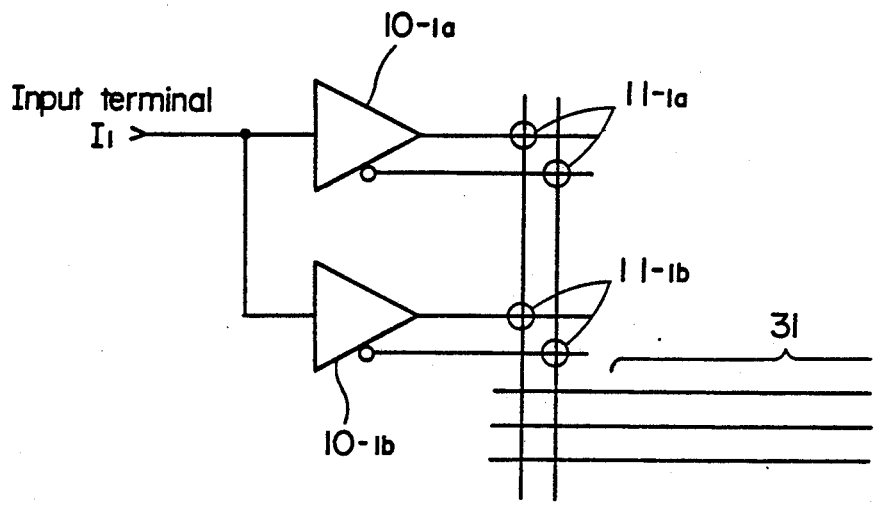
FIG. 1 is a block diagram showing a partial circuit of the input buffer segment of a programmable logic integrated circuit embodying the principle of the invention.

The outstanding feature of the prorammable logic integrated circuit according to this embodiment is that TTL level buffers (first level buffers) and C-MOS level buffers (second level buffers) are positioned in parallel in the input buffer segment 1 and output buffer segment 2, respectively. A partial circuit of the input buffer segment 1 is shown in FIG. 1. TTL level buffer $10_{-1a}$ and a C-MOS level buffer $10_{-1b}$ are connected to an input terminal $I_1$. Through transistors $11_{-1a}$ and $11_{-1b}$, respectively the outputs of these respective buffers $10_{-1a}$ and $10_{-1b}$ are connected to an internal logic formed by a matrix unit 31. Though not shown, all input buffers for the other input terminals $I_2, \ldots, I_n$ are also similarly positioned in a parallel array of TTL and C-MOS level buffers.

Figure 2:
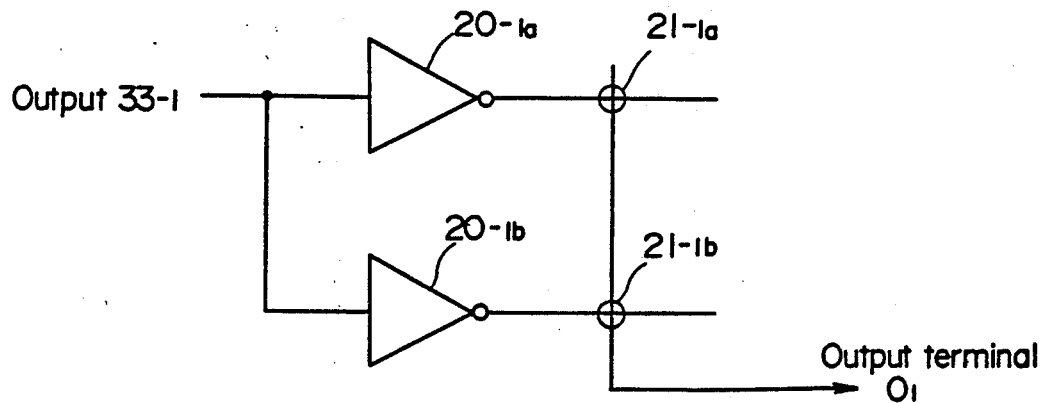
FIG. 2 is a block diagram showing a partial circuit of the output buffer segment of the same programmable logic integrated circuit.

A partial circuit of the output buffer segment 2 is shown in FIG. 2. TTL level buffer $20_{-1a}$ and a C-MOS level buffer $20_{-1b}$ are connected to an output terminal $O_1$ through transistors $21_{-1a}$ and $21_{-1b}$, respectively. The output of an exclusive OR circuit $33_{-1}$ of the programmable logic segment 3 is connected to the inputs of buffers $20_{-1a}$ and $10_{-1b}$. Though not shown, all output buffers for the other output terminals $O_2 \ldots O_n$ are also similarly positioned in parallel arrays of TTL and C-MOS level buffers.

When a TTL integrated circuit is to be connected to each of the input and output of this programmable logic integrated circuit, the transistors $11_{-1b}$ and $21_{-1b}$ are disconnected by a procedure similar to that of programming the programmable logic segment 3. Then, the input is taken in through the TTL level buffer $10_{-1a}$ and the output is also sent out through the TTL buffer $20_{-1a}$ so that smooth interfacing with the peripheral ICs is accomplished.

When a C-MOS IC is connected to each of the input and output of this programmable logic IC, the transistors $11_{-1a}$ and $21_{-1a}$ are disconnected by a procedure similar to that of programming the programmable logic segment 3. Then, the input is taken in through the C-MOS level buffer $10_{-1b}$ and the output sent out through the C-MOS level buffer $20_{-1b}$ so that smooth interfacing with the peripheral ICs can be accomplished.

In accordance with the present invention, when first level buffers, for example of TTL level, and second level buffers, for example of C-MOS level, are arranged in parallel as input and output buffers, peripheral integrated circuits can be connected, irrespective of whether they are TTL ICs or C-MOS ICs, by selecting either the TTL level or the C-MOS level according to the program without using any special interfacing circuit. Therefore, even if, for example, all the integrated circuits on the TTL integrated circuit board are replaced with C-MOS integrated circuits, it is only necessary to change the program. Because the board need not be redesigned. The development time and cost can be drastically reduced.

The above description and the accompanying drawings are merely illustrative of the principle of the present invention and are not limiting. Numerous other arrangements which embody the principle of the invention and which fall within its spirit and scope may be readily devised by those skilled in the art. Accordingly, the invention is not limited by the foregoing description, but is only limited by the scope of the appended claims.

What is claimed is:

1. A programmable logic integrated circuit comprising:
   a programmable logic segment; and
   an input buffer segment and an output buffer segment each connected to the logic segment, each buffer segment having a first buffer means for signals of a first level and a second buffer means for signals of a second level, the first and second buffer means in each segment being connected in parallel arrays and being optically selectable by means of programming the logic segment.

2. A circuit according to claim 1, wherein the first level is TTL and the second level is C-MOS.

3. A circuit according to claim 1, wherein the output and input buffer segments are connected to the programmable logic segment through a plurality of transistors.

4. A circuit according to claim 1, wherein the logic segment comprises:
   a matrix unit having a plurality of lines and rows;
   a plurality OR circuits; and
   a plurality of exclusive OR circuits.

5. A circuit according to claim 3, wherein the transistors are positioned at each junction of a line and a row of the matrix unit.

6. A method of programming a programmable logic integrated circuit for selectively interfacing with peripherals of different levels comprising:
   a) providing a programmable logic integrated circuit comprising:
      a programmable logic circuit comprising a matrix unit formed by a plurality of lines and rows, OR circuits; and exclusive OR circuits; and
      an input buffer segment and an output buffer segment connected to the logic segment, each buffer segment having a first buffer means for signals of a first level and a second buffer means for signals of a second level, the first and second buffer means in each segment being connected in parallel arrays and being optimally selected by means of programming the logic segment;
   b) selecting a peripheral input device having signals compatible with one of the first or second levels;
   c) disconnecting a plurality of transistors connecting the peripheral input device to the input buffer means for signals of the other level of the input buffer segment;
   d) receiving an input through the buffer means compatible with the peripheral input signals;
   e) disconnecting a plurality of transistors connecting the buffer means compatible with signals of the other level of the output buffer segment; and
   f) sending the output to a peripheral output device through the buffers means compatible with signal levels of the peripheral output.

* * * * *